US012591009B2

(12) United States Patent
Teboulle et al.

(10) Patent No.: US 12,591,009 B2
(45) Date of Patent: Mar. 31, 2026

(54) DETECTING THE OPEN OR CLOSED STATE OF A CIRCUIT BREAKER

(71) Applicant: SAGEMCOM ENERGY & TELECOM SAS, Rueil Malmaison (FR)

(72) Inventors: Henri Teboulle, Rueil Malmaison (FR); Pierre Lhuillier, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 446 days.

(21) Appl. No.: 17/991,607

(22) Filed: Nov. 21, 2022

(65) Prior Publication Data

US 2023/0160961 A1     May 25, 2023

(30) Foreign Application Priority Data

Nov. 22, 2021    (FR) ...................................... 2112312

(51) Int. Cl.
G01R 31/327        (2006.01)
G01R 19/00         (2006.01)
(52) U.S. Cl.
CPC ..... G01R 31/3274 (2013.01); G01R 19/0084 (2013.01); G01R 31/3275 (2013.01)

(58) Field of Classification Search
None
See application file for complete search history.

(56) References Cited

U.S. PATENT DOCUMENTS

| | | | |
|---|---|---|---|
| 8,610,424 B2 * | 12/2013 | Pelletier ............... | G01R 22/066 |
| | | | 324/76.11 |
| 2009/0198459 A1 * | 8/2009 | Bilac ........................ | H02H 3/33 |
| | | | 702/58 |
| 2018/0372800 A1 * | 12/2018 | Blanchard .......... | G01R 31/3277 |
| 2020/0209293 A1 * | 7/2020 | Teboulle .............. | H02H 1/0007 |
| 2020/0309856 A1 * | 10/2020 | Teboulle ................ | G01R 22/00 |

* cited by examiner

*Primary Examiner* — Nasima Monsur
(74) *Attorney, Agent, or Firm* — MUNCY, GEISSLER, OLDS & LOWE, P.C.

(57)              ABSTRACT
A meter including a phase conductor connected to a phase line of the network, a cut-off member, and a detection circuit comprising: an injection chain arranged, while the cut-off member is open, to generate a test signal with a predetermined voltage level, and arranged to inject the test signal into the phase conductor downstream from the cut-off member; a measurement chain arranged to measure an intermediate voltage level of the test signal at a measurement point of the injection chain, which point is situated between the generator component and the injection component; a processor component arranged to act as a function of the intermediate voltage level in order to determine whether the circuit breaker is open or closed.

16 Claims, 1 Drawing Sheet

DETECTING THE OPEN OR CLOSED STATE OF A CIRCUIT BREAKER

The invention relates to the field of electricity meters.

BACKGROUND OF THE INVENTION

Modern electricity meters are electronic meters that are said to be "smart", which meters are of course designed to measure the electrical energy delivered by a distributor to an electrical installation via a distribution network, but they are also capable of performing a certain number of additional functions: receiving instructions to manage tariffs, remote meter reading and programming, customer information, etc.

Some electricity meters include a cut-off device (situated inside the meter) that enables them to be operated either remotely or else from the electricity meter itself in order to connect and to disconnect the electrical installation selectively to and from the distribution network. The cut-off member is used in particular for remotely interrupting or re-establishing the supply of power to the installation, e.g. in the event of the subscription being cancelled or of the subscription contract not being complied with.

Electrical installations are also themselves frequently fitted with a circuit breaker, which circuit breaker is situated outside the meter and the downstream therefrom (i.e. on its installation side). The circuit breaker, which can be actuated by the subscriber, serves in particular to protect the subscriber's electrical installation by opening in the event of a surge occurring in the distribution network, e.g. resulting from a short-circuit between two phases or between one of the phases and neutral.

In certain countries, after the cut-off member has been opened, subscribers are asked to open and then re-close the circuit breaker before the cut-off member is re-closed.

In order to be able to re-establish the supply of electricity to the subscriber automatically, it is then advantageous for the meter to be capable, while the cut-off member is open, of detecting whether the circuit breaker is open or closed.

To perform this detection, proposals have been made to deliver a fraction of the voltage present on the network to a point downstream from the cut-off member and to "zoom-in" on the resulting voltage by means of an adjustable voltage divider in order to measure accurately the impedance that is present downstream from the meter. That system serves to distinguish between a circuit breaker that is open and a circuit breaker that is closed (and in particular a circuit breaker that is closed on a node that is very small and that therefore presents an impedance that is high). That detection system is thus relatively effective, but it requires a measurement to be taken of a voltage level that is very low (a few millivolts (mV)) in order to distinguish between the open and closed states of the circuit breaker. That detection system is thus relatively sensitive to noise.

OBJECT OF THE INVENTION

An object of the invention is to act from inside the meter in a manner that is reliable and robust in order to detect the open or closed state of the circuit breaker while the cut-off member is open.

SUMMARY OF THE INVENTION

In order to achieve this object, there is provided a meter arranged to measure electrical energy delivered to an installation by a distribution network having a phase line and a neutral line, the meter being arranged to be connected to a circuit breaker situated outside the meter and downstream therefrom, the meter comprising:

a phase conductor and a neutral conductor arranged to be connected respectively to the phase line and to the neutral line of the distribution network;

a cut-off member connected in the phase conductor;

a detection circuit comprising:

an injection chain comprising at least one generator component and an injection component, the at least one generator component being arranged, while the cut-off member is open, to generate a test signal with a predetermined voltage level, the injection component being arranged to inject the test signal into the phase conductor downstream from the cut-off member;

a measurement chain arranged to measure an intermediate voltage level of the test signal at a measurement point of the injection chain, which point is situated between the at least one generator component and the injection component;

a processor component arranged to act as a function of the intermediate voltage level in order to determine whether the circuit breaker is open or closed.

By injecting a test signal into the phase conductor, the detection circuit of the electricity meter of the invention makes it possible to detect whether the circuit breaker and is open or closed while the cut-off member is open.

The difference in the levels of the intermediate voltage between the open and closed states of circuit breaker is typically of the order of 1 volt (V) or of about 100 mV, and it is thus easily measurable. Detection is less sensitive to noise and thus more reliable and more robust than in the prior art.

There is also provided a meter as described above, the injection component being a first capacitor that is integrated in a first highpass filter serving to filter out interfering signals coming from the distribution network.

There is also provided a meter as described above, wherein the at least one generator component comprises both a generator module arranged to produce the test signal with the predetermined voltage level and also a driver forming a current source arranged to ensure that the test signal is generated with a current level that is sufficient for conserving a voltage level at the output of the at least one generator component that is equal to the predetermined voltage level.

There is also provided a meter as described above, wherein the measurement chain comprises in succession, from upstream to downstream, a second highpass filter, an envelope detector, and a lowpass filter.

There is also provided a meter as described above, further comprising an analog-to-digital converter positioned upstream from the envelope detector.

There is also provided a meter as described above, further comprising an analog-to-digital converter positioned downstream from the envelope detector.

There is also provided a meter as described above, the injection chain being arranged, while the cut-off member is open, to inject the test signal periodically for a predetermined duration.

There is also provided a meter as described above, the injection chain being arranged, while the cut-off member is open, to inject the test signal continuously.

There is also provided a meter as described above, wherein the test signal is an alternating signal at a frequency that is at least one hundred times greater than the frequency of the phase current flowing in the phase line of the distribution network.

There is also provided a meter as described above, the meter being a single-phase meter.

There is also provided a meter as described above, wherein the phase conductor is connected to electrical ground of the meter upstream from the cut-off member, the meter further comprising a second capacitor positioned upstream from the cut-off member and having a first terminal connected to the neutral conductor and a second terminal connected to the phase conductor.

There is also provided a meter as described above, the injection component being a first capacitor, the injection chain including a resistor connected between the first capacitor and an output of the at least one generator component, the processor component being arranged to compare the intermediate voltage level of the test signal with a predetermined detection threshold, and to detect that the circuit breaker is open when the intermediate voltage level of the test signal is greater than the predetermined threshold and that the circuit breaker is closed when the intermediate voltage level of the test signal is less than or equal to the predetermined detection threshold, the predetermined detection threshold lying between a high level and a low level Vb such that:

$$Vb=Vp*(Z(C1)+Z(\text{subscriber})+Z(C2)\|Z(\text{upstream}))/$$
$$(R+Z(C1)+Z(\text{subscriber})+Z(C2)\|Z(\text{upstream})),$$
where:

Vp is the predetermined voltage level, $Z(C1)$ is the impedance of the first capacitor, $Z(C2)$ is the impedance of the second capacitor, $Z(\text{upstream})$ is the impedance between the phase line and the neutral line upstream from the meter, and $Z(\text{subscriber})$ is the impedance between the phase line and the neutral line downstream from the meter, said impedances being estimated at the frequency of the test signal.

There is also provided a meter as described above, the meter being a three-phase meter.

There is also provided a meter as described above, the injection component being a first capacitor, the injection chain including a resistor connected between the first capacitor and an output of the at least one generator component, the processor component being arranged to compare the intermediate voltage level of the test signal with a predetermined detection threshold, and to detect that the circuit breaker is open when the intermediate voltage level of the test signal is greater than the predetermined threshold and that the circuit breaker is closed when the intermediate voltage level of the test signal is less than or equal to the predetermined detection threshold, the predetermined detection threshold lying between a high level and a low level Vb such that:

$$Vb=Vp*(Z(C1)+Z(\text{subscriber}))/(R+Z(C1)+Z(\text{subscriber}))\text{ where:}$$

Vp is the predetermined voltage level of the test signal, $Z(C1)$ is the impedance of the first capacitor, and $Z(\text{subscriber})$ is the impedance between the phase line and the neutral line downstream from the meter, said impedances being estimated at the frequency of the test signal.

There is also provided a detection method performed in the processor component of a meter as described above, the method comprising the following steps performed while the cut-off member is open:

using the injection chain and to generate and inject the test signal into the phase conductor downstream from the cut-off member;

acquiring the intermediate voltage level of the test signal;

as a function of the intermediate voltage level of the test signal, determining whether the circuit breaker is open or closed.

There is also provided a computer program including instructions that cause the processor component of the meter as described above to execute the steps of the detection method as described above.

There is also provided a computer-readable storage medium, storing the above-described computer program.

The invention can be better understood in the light of the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
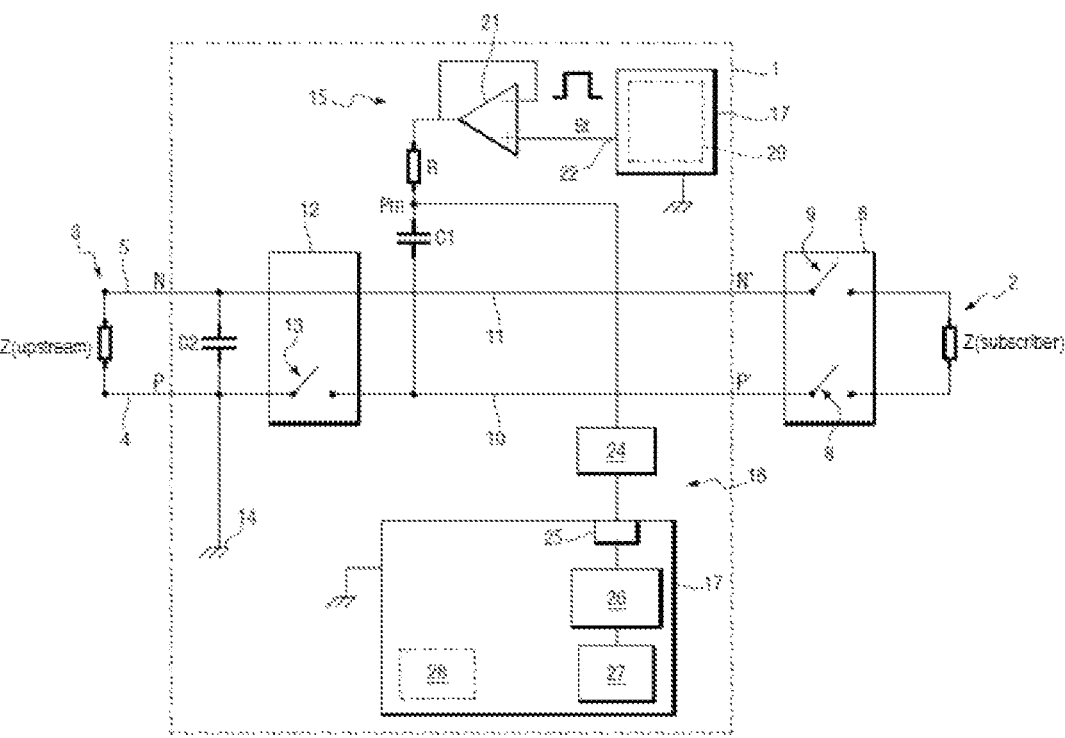
FIG. 1 shows an electricity meter in a first embodiment of the invention, the electricity meter being a single-phase meter.

With reference to FIG. 1, the electricity meter 1 in a first embodiment of the invention is a single-phase meter for measuring the energy supplied to a subscriber's electrical installation 2 by a distribution network 3.

The distribution network 3 comprises a phase line 4 and a neutral line 5.

A circuit breaker 6 is situated outside the meter 1, and a downstream therefrom. In this specification, when referring to the positions of various elements relative to the installation 2 and to the network 3, the following terminology convention is used:

"upstream": on the side of the network 3;

"downstream": on the side of the installation 2.

The circuit breaker 6 is positioned between the meter 1 and the installation 2.

The meter 1 has an upstream phase port P connected to the phase line 4 and an upstream neutral port N connected to the neutral line 5. The meter 1 also has a downstream phase port P' and a downstream neutral port N'.

The downstream phase port P' and the downstream neutral port N' of the meter 1 are connected to the installation 2 via respective switches 8 and 9, both of which are integrated in the circuit breaker 6.

The meter 1 also has a phase conductor 10 that is connected to the phase line 4 of the distribution network 3 via the upstream phase port P, and that is connected to the circuit breaker 6 via the downstream phase port P'. The meter 1 also has a neutral conductor 11 that is connected to the phase line 5 via the upstream neutral port N, and that is connected to the circuit breaker 6 via the downstream neutral port N'.

The meter 1 also includes a cut-off member 12 comprising a switch 13 connected in the phase conductor 10.

The meter 1 also has an electrical ground 14. The phase conductor 10 is connected to that ground 14 in the proximity of the upstream phase port P and upstream from the cut-off member 12. This grounding of the phase conductor 10 is explained by the fact that the meter 1 includes a current sensor serving to measure the phase current flowing in the phase line 4, which sensor is a shunt (not shown) that is positioned in the phase conductor 10 upstream from the cut-off member 12. If the phase conductor 10 were not grounded, the voltage at the terminals of the shunt would be of the same order as the voltage present between the phase and neutral lines of the network 3, and thus very high. Grounding the phase conductor 10 serves to obtain a low voltage at the terminals of the shunt (in this example of the order of 3.3 V at most after applying a gain, it being understood that the voltage at the terminals of the shunt is of the order of 15 mV to 20 mV when passing a root mean square (RMS) current of 100 amps (A)), which corresponds to the voltage range that is acceptable as input for the metrological microcontroller (not shown) that is integrated in the meter 1.

The meter 1 also includes a detection circuit.

The detection circuit comprises an injection chain 15, a measurement chain 16, and a processor component.

In this specification, the term "chain" is used to mean a succession of one or more components (or functional modules) connected in series.

The injection chain 15 includes at least one generator component (specifically two generator components in this example), a resistor R, and an injection component (specifically a first capacitor C1 in this example).

The two generator components comprise a generator module 20 that is integrated in the application microcontroller 17 of the meter 1, and a driver 21.

The microcontroller 17 has a pulse width modulation (PWM) output 22. The output of the generator module 20 is connected to the PWM output 22.

The driver 21 in this example is connected as a voltage follower amplifier. The output 22 of the microcontroller 17 is connected to the non-inverting input of the driver 21. The inverting input of the driver 21 is connected to the output of the driver 21.

The output of the driver 21 is connected to a first terminal of the resistor R, which has its second terminal connected to a first terminal of the first capacitor C1. The second terminal of the first capacitor C1 is connected to the phase conductor 10 downstream from the cut-off member 12.

The resistor R in this example presents a resistance that is equal to 1 kilohm (kΩ). In the equations herein, "R" is also used to designate the impedance of the resistor R.

The first capacitor C1 in this example has capacitance that is equal to 47 nanofarads (nF). The first capacitor C1 is integrated in a first highpass filter (an R-C1 filter) serving to filter out interfering signals coming from the distribution network 3.

The measurement chain 16 comprises the following elements, arranged in succession from upstream to downstream: a second highpass filter 24, an analog-to-digital converter (ADC) 25, an envelope detector 26, and a lowpass filter 27.

In this specification, when referring to the relative positions of the various elements in the measurement chain 16, the following terminology convention is used:

"upstream": on the side of the magnitude being measured;

"downstream": on the measurement processing side.

In this example, the second highpass filter 24 is thus an analog filter, while the envelope detector 26 and the lowpass filter 27 are digital modules.

In this example, the ADC 25, the envelope detector 26, and the lowpass filter 27 are integrated in the microcontroller 17.

In this example, the processor component of the detection circuit is the microcontroller 17.

The microcontroller 17 is adapted to execute instructions of a program for performing the detection method described below. The program is stored in a memory 28 that is integrated in or connected to the microcontroller 17.

The meter 1 also has a second capacitor C2 positioned upstream from the cut-off member 12 and having a first terminal connected to the neutral conductor 11 and a second terminal connected to the phase conductor 10. The capacitance of the second capacitor C2 is typically equal to the capacitance of the first capacitor C1, i.e., in this example, equal to 47 nF. The second capacitor C2, positioned in this way between the neutral and phase conductors 11 and 10, serves to constitute a controlled ground return path while detection measurements are being taken (it should be recalled that the measurements are taken while the cut-off member 12 is open).

The way in which the invention operates is described in detail below.

While the cut-off member 12 is open, the injection chain 15 injects a test signal St periodically and for a predetermined duration. By way of example, the period is equal to 1 second (s) and the predetermined duration is equal to 500 milliseconds (ms), i.e., while the cut-off member 12 is open, the test signal St is injected for 500 ms, and this is done once every second.

Alternatively, while the cut-off member 12 is open, the injection chain 19 could inject the test signal St continuously.

To perform this injection, the generator module 20 of the microcontroller 17 produces the test signal St and applies it to the output 22.

In this example, the test signal St is a square (or rectangular) wave signal alternating at a frequency that is advantageously at least 100 times greater than the frequency of the phase current flowing in the phase line 4 of the distribution network 3.

In this example, the frequency of the phase current is equal to 50 hertz (Hz), and the frequency of the test signal St is equal to 10 kilohertz (kHz).

The test signal St is generated by the microcontroller 17 at a predetermined voltage level, which is equal to 3.3 V (peak to peak) in this example.

The test signal St is applied to the non-inverting input of the driver 21, and it is thus reproduced at the output of the driver 21.

The driver 21 forms a current source supplying additional current serving to ensure that the test signal St is generated with sufficient current to ensure that the voltage level at the output from the generator components (i.e. at the output of the driver 21) is at the predetermined voltage level. The driver 21 is necessary in this example since the various elements making up and connected to the injection chain 15 "draw" more current than the microcontroller 17 is capable of delivering on its own.

The resistor R serves to limit the current.

The first capacitor C1 serves to inject the test signal St as produced by the microcontroller 17 and the driver 21 into the phase conductor 10 downstream from the cut-off member 12.

The measurement chain 16 serves to measure an intermediate voltage level of the test signal St at a measurement point Pm of the injection chain 15, which point is situated between the at least one generator component and the injection component.

In this example, the measurement point Pm is situated between the resistor R and the first capacitor C1.

In this example, the second highpass filter 24 is an active highpass filter of gain equal to 1. The cut-off frequency of the second highpass filter 24 is typically equal to 5 kHz. Being situated upstream from the ADC 25, the second highpass filter 24 serves both to eliminate any 50 Hz (as might be picked up by the antenna effect while both the cut-off member 12 and the circuit breaker 6 are open) and also to eliminate any disturbances that might come from the network 3. The second highpass filter 24 thus serves to present the ADC 25 with a signal that is undisturbed. It then suffices to detect the envelope of the signal (via the digital envelope detector 26) and to filter the output from the detector 26 digitally by means of the lowpass filter 27, which has a cut-off frequency that is typically equal to 10 Hz.

The microcontroller 17 compares the measured intermediate voltage level of the test signal St with a predetermined threshold, and it determines that the circuit breaker 6 is open when the intermediate voltage level of the test signal St is greater than the predetermined threshold, and that the circuit breaker 6 is closed when the intermediate voltage level of the test signal St is less than or equal to the predetermined threshold.

Specifically, while the circuit breaker 6 is open, the signal input to the ADC 25 is high.

It is assumed in this example that, at 10 kHz, the modulus of the load Z(subscriber) and the modulus of the load Z(upstream) are both very small compared with the resistance of the resistor R (although this need not necessarily be so, at least so far as concerns Z(subscriber): see below).

After lowpass filtering, the measured intermediate voltage level is equal to a high level Vh equal to 3.3 V (i.e. to the predetermined voltage level Vp of the test signal St).

In contrast, while the circuit breaker 6 is closed, the signal input to the ADC 25 is substantially lower.

After lowpass filtering, the measured intermediate voltage level is equal to a low level Vb, which by voltage division is equal to:

$$Vb=Vp*(Z(C1)+Z(\text{subscriber})+Z(C2)\|Z(\text{upstream}))/$$
$$(R+Z(C1)+Z(\text{subscriber})+Z(C2)\|Z(\text{upstream}))$$

where:

Z(C1) is the impedance of the first capacitor, Z(C2) is the impedance of the second capacitor, Z(upstream) is the impedance between the phase line and the neutral line upstream from the meter 1, and Z(subscriber) is the impedance between the phase line and the neutral line downstream from the meter 1, where said impedances are estimated at the frequency of the test signal (i.e. 10 kHz), and where the symbol "∥" is used to mean "in parallel with".

The predetermined threshold Sp thus lies between the high level Vh (equal in this example to the predetermined voltage level Vp) and the low level Vb.

In this example, the low level is equal to 1.06 V.

The "ideal" predetermined threshold Sp, as used in this example, is thus such that:

$$Sp=(Vh+Vb)/2=2.18 \text{ V}.$$

It should be observed that by default, the PWM output 22 is at 0, such that no test signal St is injected at the measurement point. Likewise, this always applies while the cut-off member 12 is closed.

Figure 2:
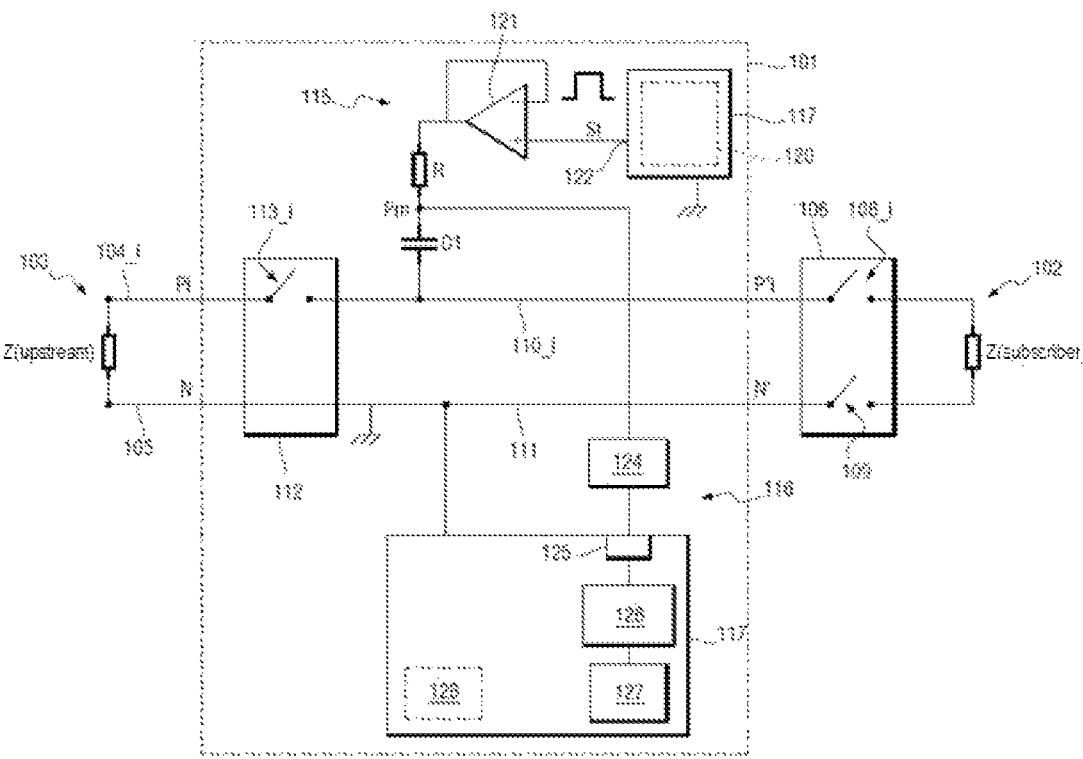
FIG. 2 shows an electricity meter in a second embodiment of the invention, the electricity meter being a three-phase meter.

With reference to FIG. 2, the meter 101 in a second embodiment of the invention is a three-phase meter. Each element shown in FIG. 2, and that is similar to an element in FIG. 1, is given a reference by adding 100 to the reference in FIG. 1.

The distribution network 103 has three phase lines 104_i (i ranging from 1 to 3) and a neutral line 105.

For each phase line 104_i, the meter 101 has a respective upstream phase port Pi connected to said phase line 104_i, and a respective downstream phase port P'i.

The meter 101 also has an upstream neutral port N connected to the neutral line 105 and a downstream neutral port N'.

The downstream phase ports P'i and the downstream neutral port N' of the meter 101 are connected to the installation 102 respectively via switches 108_i and via a switch 109 that are integrated in the circuit breaker 106.

For each phase line 104_i, the meter 101 also includes a respective phase conductor 110_i connected to said phase line 104_i via the associated upstream phase port Pi. The meter 101 also has an upstream neutral conductor 111 connected to the neutral line 105 via the upstream neutral port N.

The meter 101 also includes a cut-off member 112 comprising, for each phase line, a respective switch 113_i connected in the associated phase conductor 110_i.

The meter 101 also has a detection circuit that serves, while the cut-off member 112 is open, to detect whether the circuit breaker 106 is open or closed.

It is known that the four switches 108_i, 109 of the circuit breaker 106, and also the three switches 113_i of the cut-off member 112 are either all open simultaneously or else all closed simultaneously.

Consequently, in this example, the meter 101 has only one detection circuit that is connected to only one of the phase conductors 110_i (connected to the phase line 104_i shown in FIG. 2). Nevertheless, the meter 101 could perfectly well have a plurality of detection circuits in order to confirm the result and thereby improve the robustness of detection.

The detection circuit of the meter 101 operates in the same manner as the detection circuit of the meter 1.

The detection circuit has an injection chain 115 comprising the generator module 120 integrated in the application microcontroller 117 and the driver 121 (the two generator components), a first capacitor C1 (the injection component), and a resistor R connected between the output of the driver 121 and the first capacitor C1. The first capacitor C1 and the resistor R form a first highpass filter.

The detection circuit also has a measurement chain 116 comprising an (analog) second highpass filter 124, an ADN 125, a (digital) envelope detector 126, and a (digital) lowpass filter 127.

The detection circuit also has a processor component, specifically the microcontroller 117 (having integrated therein the ADC 125, the envelope detector 126, and the lowpass filter 127).

It should be observed that with a three-phase meter 101, for each phase line 104_i, the current sensor used for measuring the phase current flowing in said phase liner 104_i is a torus and not a shunt. The neutral conductor 105 can thus be connected to a ground (electrical ground 114) that is visible to the microcontroller 117, such that the second capacitor C2 is not necessary.

While the cut-off member 112 is open, the test signal St is generated and injected in the same manner as for the above-described detection circuit.

Once again it is assumed that, at 10 kHz, the modulus of the load Z(subscriber) is very small compared with the resistance of the resistor R.

While the circuit breaker 106 is open, the measured intermediate voltage level is equal to a high level Vh equal to 3.3 V (i.e. to the predetermined voltage level Vp of the test signal St).

While the circuit breaker 106 is closed, the measured intermediate voltage level is substantially smaller. After lowpass filtering, the measured intermediate voltage level is equal to a low level Vb, which is equal to:

$$Vb=Vp*(Z(C1)+Z(\text{subscriber}))/(R+Z(C1)+Z(\text{subscriber})) \text{ where:}$$

Z(C1) is the impedance of the first capacitor, and Z(subscriber) is the impedance between the phase line and the neutral line downstream from the meter, where said impedances are estimated at the frequency of the test signal (in this example 10 kHz).

The predetermined threshold Sp thus lies between the high level Vh and the low level Vb.

In this example, the low level Vb is equal to 1.06 V.

The "ideal" predetermined threshold Sp, as used in this example, is thus such that:

$$Sp=(Vh+Vb)/2=2.18 \text{ V.}$$

It should be observed that, both in a single-phase meter 1 and in a three-phase meter 101, it is assumed that, at 10 kHz, the modulus of the load Z(subscriber) is very small compared with the resistance of the resistor R.

However, this "standard" configuration does not necessarily apply.

The impedance Z(subscriber) need not be negligible compared with the resistance of the resistor R, and indeed it may be substantially greater than that resistance, although the impedance Z(upstream) is less than or equal to 2Ω, and is always negligible compared with the resistance of the resistor R.

By way of example, this occurs in Spain, where in a worst-case scenario the circuit breaker 6 (or 106) is geographically remote from the meter 1 (or 101).

Under such circumstances, while the circuit breaker is open, the cable between the meter and the circuit breaker applies an equivalent impedance to the terminals of the meter that depends on the length and on the nature of the cable, which impedance may be as much as 1200 kΩ.

While the circuit breaker is closed, in addition to those 1200 kΩ, there is in parallel an impedance Z(subscriber) that may be as much as 210 kΩ.

In this "Spanish-type" configuration, in order to improve the difference between the intermediate voltage level measured at the point Pm while the circuit breaker is open (high level Vh) and while the circuit breaker is closed (low level Vb), the resistance and capacitance values of the resistor R and of the capacitor C1 are modified (with the capacitance of the capacitor C2 remaining unchanged at 47 nF).

By way of example, the following values are selected: R=22 kΩ and C1=2.2 nF.

Thus, in this "Spanish-type" configuration, the following intermediate voltage values are obtained, whether in single-phase or in three-phase (using the above formulas):

circuit breaker open: Vh=3.24 V;
circuit breaker closed: Vb=2.94 V;
which gives an "ideal" predetermined threshold Sp:
Sp=3.09 V.

Furthermore, these "new" values for R and for C1 are entirely applicable to the "standard" configuration described previously (Z(subscriber)<<R and no applied impedance of 1200 kΩ).

In the "standard" configuration, the calculated new values for the components are as follows:

circuit breaker open: Vh=3.3 V;
circuit breaker closed: Vb=1.03 V.

The "ideal" predetermined threshold Sp is thus such that:
Sp=2.17 V.

It should also be observed that a predetermined threshold Sp equal to 3.09 V, instead of 2.17 V, is compatible both with the "Spanish-type" configuration and with the "standard" configuration.

It should also be observed that the 3 decibel (dB) cut-off frequency of the highpass filter R-C1 remains practically unchanged to within 3% when using the values for the "standard" configuration or the values for the "Spanish-type" configuration, since it changes from 3386 Hz to 3288 Hz.

Naturally, the invention is not limited to the embodiments described, but covers any variant coming within the ambit of the invention as defined by the claims.

The envelope detector, which is described above as being digital, could equally well be analog, and would then be positioned upstream from the ADC.

The capacitance values for the first capacitor C1 and for the second capacitor C2 could be other than those given above. Likewise, The resistance of the resistor R could be modified, typically by being increased.

The frequency of the test signal could equally well be modified, which would make it necessary to adapt the predetermined detection threshold to obtain equivalent results. The predetermined detection threshold could be settable.

The driver is not essential. In particular, if the generator module that generates the test signal (the application microcontroller in the description above) is capable of delivering sufficient current, then there is no need for a driver.

The microcontroller in which the invention is performed need not necessarily be the application microcontroller, but could be a distinct component.

The processor component in which the invention is performed need not necessarily be a microcontroller, but it could be some other component, for example it could be a conventional processor, a digital signal processor (DSP), or indeed a programmable logic circuit such as a field programmable gate array (FPGA) or an application specific integrated circuit (ASIC).

The invention claimed is:

1. A meter arranged to measure electrical energy delivered to an installation by a distribution network comprising a phase line and a neutral line, the meter being arranged to be connected to a circuit breaker situated outside the meter and downstream therefrom, the meter comprising:

a phase conductor and a neutral conductor arranged to be connected respectively to the phase line and to the neutral line of the distribution network;

a cut-off member connected in the phase conductor;

a detection circuit comprising:

an injection chain comprising at least one generator component and an injection component, the at least one generator component being arranged, while the cut-off member is open, to generate a test signal with a predetermined voltage level, the injection component being arranged to inject the test signal into the phase conductor downstream from the cut-off member, the injection component having a first terminal connected to the at least one generator component and a second terminal connected to the phase conductor;

a measurement chain arranged to measure an intermediate voltage level of the test signal at a measurement point (Pm) of the injection chain, which point is situated between the at least one generator component and the injection component and is connected to the at least one generator component and to the first terminal of the injection component;

a processor component arranged to act as a function of the intermediate voltage level in order to determine whether the circuit breaker is open or closed.

2. The meter according to claim 1, wherein the injection component is a first capacitor that is integrated in a first highpass filter serving to filter out interfering signals coming from the distribution network.

3. The meter according to claim 1, wherein the at least one generator component comprises both a generator module arranged to produce the test signal with the predetermined voltage level and also a driver forming a current source arranged to ensure that the test signal is generated with a current level that is sufficient for conserving a voltage level at the output of the at least one generator component that is equal to the predetermined voltage level.

4. The meter according to claim 1, wherein the measurement chain comprises in succession, from upstream to downstream, a second highpass filter, an envelope detector, and a lowpass filter.

5. The meter according to claim 4, further comprising an analog-to-digital converter positioned upstream from the envelope detector.

6. The meter according to claim 4, further comprising an analog-to-digital converter positioned downstream from the envelope detector.

7. The meter according to claim 1, wherein the injection chain is arranged, while the cut-off member is open, to inject the test signal periodically for a predetermined duration.

8. The meter according to claim 1, wherein the injection chain is arranged, while the cut-off member is open, to inject the test signal continuously.

9. The meter according to claim 1, wherein the test signal is an alternating signal at a frequency that is at least one hundred times greater than the frequency of the phase current flowing in the phase line of the distribution network.

10. The meter according to claim 1, wherein the meter is a single-phase meter.

11. The meter according to claim 10, wherein the phase conductor is connected to electrical ground of the meter upstream from the cut-off member, the meter further comprising a second capacitor positioned upstream from the cut-off member and having a first terminal connected to the neutral conductor and a second terminal connected to the phase conductor.

12. The meter according to claim 11, wherein the injection component is a first capacitor, the injection chain comprising a resistor connected between the first capacitor and an output of the at least one generator component, the processor component being arranged to compare the intermediate voltage level of the test signal with a predetermined detection threshold, and to detect that the circuit breaker is open when the intermediate voltage level of the test signal is greater than the predetermined threshold and that the circuit breaker is closed when the intermediate voltage level of the test signal is less than or equal to the predetermined detection threshold, the predetermined detection threshold lying between a high level and a low level Vb such that:

$$Vb=Vp*(Z(C1)+Z(\text{subscriber})+Z(C2)\|Z(\text{upstream}))/(R+Z(C1)+Z(\text{subscriber})+Z(C2)\|Z(\text{upstream}))$$

where:

Vp is the predetermined voltage level, Z(C1) is the impedance of the first capacitor, Z(C2) is the impedance of the second capacitor, Z(upstream) is the impedance between the phase line and the neutral line upstream from the meter, and Z(subscriber) is the impedance between the phase line and the neutral line downstream from the meter, said impedances being estimated at the frequency of the test signal.

13. The meter according to claim 1, wherein the meter is a three-phase meter.

14. The meter according to claim 13, wherein the injection component is a first capacitor, the injection chain including a resistor connected between the first capacitor and an output of the at least one generator component, the processor component being arranged to compare the intermediate voltage level of the test signal with a predetermined detection threshold, and to detect that the circuit breaker is open when the intermediate voltage level of the test signal is greater than the predetermined threshold and that the circuit breaker is closed when the intermediate voltage level of the test signal is less than or equal to the predetermined detection threshold, the predetermined detection threshold lying between a high level and a low level Vb such that:

$$Vb=Vp*(Z(C1)+Z(\text{subscriber}))/(R+Z(C1)+Z(\text{subscriber}))$$

where:

Vp is the predetermined voltage level of the test signal, Z(C1) is the impedance of the first capacitor, and Z(subscriber) is the impedance between the phase line and the neutral line downstream from the meter, said impedances being estimated at the frequency of the test signal.

15. A detection method performed in the processor component of the meter according to claim 1, the method comprising the following steps performed while the cut-off member is open:

using the injection chain to generate and inject the test signal into the phase conductor downstream from the cut-off member;

acquiring the intermediate voltage level of the test signal;

as a function of the intermediate voltage level of the test signal, determining whether the circuit breaker is open or closed.

16. A non-transitory computer-readable storage medium storing a computer program including instructions that cause the processor component of the meter according to claim 1 to execute a detection method performed in the processor component of the meter, the method comprising the following steps performed while the cut-off member is open:

using the injection chain to generate and inject the test signal into the phase conductor downstream from the cut-off member;

acquiring the intermediate voltage level of the test signal;

as a function of the intermediate voltage level of the test signal, determining whether the circuit breaker is open or closed.

* * * * *